United States Patent [19]
Forseth et al.

[11] Patent Number: 5,940,027
[45] Date of Patent: Aug. 17, 1999

[54] HIGH ACCURACY LOW POWER GPS TIME SOURCE

[75] Inventors: Daniel C. Forseth, Cedar Rapids; Paul G. Jagnow, Iowa City; Mark W. Johnson, Cedar Rapids; F. Britt Snodgrass, Robins; Larry D. Vittorini, Cedar Rapids, all of Iowa

[73] Assignee: Rockwell International Corporation, Costa Mesa, Calif.

[21] Appl. No.: 08/940,634

[22] Filed: Sep. 30, 1997

[51] Int. Cl.⁶ ................................ G01S 5/02; H04B 7/185
[52] U.S. Cl. .................. 342/357.06; 331/18; 331/66; 331/176; 701/213
[58] Field of Search ......................... 342/352, 357; 701/213; 331/66, 69, 70, 18, 60, 158, 176

[56] References Cited

U.S. PATENT DOCUMENTS

| | | | |
|---|---|---|---|
| 4,448,543 | 5/1984 | Vail | 368/202 |
| 4,513,259 | 4/1985 | Frerking | 331/176 |
| 5,379,223 | 1/1995 | Asplund | 364/434 |
| 5,459,436 | 10/1995 | Pucci et al. | 331/66 |
| 5,515,057 | 5/1996 | Lennen et al. | 342/357 |
| 5,629,649 | 5/1997 | Ujiie | 331/17 |
| 5,654,718 | 8/1997 | Beason et al. | 342/357 |

Primary Examiner—Thomas Tarzca
Assistant Examiner—Dao L. Phan
Attorney, Agent, or Firm—Kyle Eppele; James P. O'Shaughnessy

[57] ABSTRACT

A global positioning system (GPS) receiver and high accuracy low power time source (HAL) are disclosed. The HAL provides a time source having an accuracy which is high enough for the receiver to achieve fast direct Y-code acquisition. The HAL includes an oscillator adapted to provide an uncompensated frequency signal at a desired frequency. Frequency conversion circuitry receives the uncompensated frequency signal and a control signal as inputs, and provides as an output a compensated frequency signal having an average compensated frequency which is closer to the desired frequency than is the average uncompensated frequency. A temperature sensor provides an output indicative of a temperature of the oscillator. Frequency error determining circuitry determines an error value, as a function of the temperature sensor output, which is indicative of a quantity of frequency error over time in the uncompensated frequency signal. The frequency error determining circuitry generates the control signal as a function of the determined quantity of frequency error in the uncompensated frequency signal. A counter receives the compensated frequency signal from the frequency conversion circuitry and provides as an output a digital representation of a time period based upon the compensated frequency signal.

17 Claims, 6 Drawing Sheets

HIGH ACCURACY LOW POWER GPS TIME SOURCE

FIELD OF THE INVENTION

The present invention relates generally to a low power time source (LPTS) for use in global positioning system (GPS) receivers. More particularly, the present invention relates to a high accuracy LPTS (HAL) and a GPS receiver using the same. The HAL of the present invention improves the time keeping accuracy of the time source, thus enabling faster direct Y-code GPS signal acquisition.

BACKGROUND OF THE INVENTION

The GPS is a satellite based navigation system having multiple orbiting satellites. Theoretically, four or more GPS satellites will be visible from most points on or near the Earth's surface, 24 hours per day. Each GPS satellite transmits two spread spectrum, L-band signals: an L1 signal having a frequency f1 of 1575.42 MHz, and an L2 signal having a frequency f2 of 1227.6 MHz. The L1 signal from each satellite is modulated by two pseudo-random codes, the coarse acquisition (C/A) code and the P-code. The P-code is normally encrypted, with the encrypted version of the P-code referred to as the Y-code. The L2 signal from each satellite is modulated by the Y-code. Hereafter, all references in this document to Y-code apply to P-code as well.

Because the Y-code is much more difficult to acquire directly than is the C/A-code, GPS receivers traditionally acquire the C/A-code first. Then, information useful in acquiring the Y-code signal is obtained and used during Y-code acquisition. However, in some instances, it is desirable to acquire the Y-code without acquiring the C/A-code first.

Direct Y-code acquisition requires an accurate clock reference. Real time GPS clocks or time sources are often driven by quartz crystal oscillator circuits. The oscillator circuit drives a counter which counts oscillator output cycles. In order to minimize power consumption for battery powered applications, it is customary to use a low frequency crystal (for example 32.768 kHz). Most crystals in the 10 kHz to 600 kHz frequency range use a quartz resonating element shaped like a miniature tuning fork. The frequency of tuning fork crystals varies with temperature in an approximately parabolic manner as illustrated in FIG. 2. As a result, the LPTS used in existing GPS receivers have frequency drifts of up to 250 parts per million (ppm) over temperature.

The temperature dependent frequency drifts in the LPTS used in conventional GPS receivers results in very large time errors when the receiver has been off for more than a few minutes. Since Y-code acquisition time is directly proportional to time uncertainty, this in turn results in acquisition performance that is unacceptable for direct Y-code acquisition due to hardware constraints. Consequently, a highly accurate wide temperature range LPTS which can overcome these problems in order to reduce the time required for the GPS receiver to directly acquire the Y-code would be a significant improvement in the art.

SUMMARY OF THE INVENTION

A global positioning system (GPS) receiver and high accuracy low power time source (HAL) are disclosed. The HAL provides a time source having an accuracy which is high enough for the receiver to achieve fast direct Y-code acquisition. The HAL includes an oscillator adapted to provide an uncompensated frequency signal at a desired frequency. Frequency conversion circuitry receives the uncompensated frequency signal and a control signal as inputs, and provides as an output a compensated frequency signal having an average compensated frequency which is closer to the desired frequency than is the average uncompensated frequency. A temperature sensor provides an output indicative of the temperature of the oscillator. Frequency error determining circuitry determines an error value, as a function of the temperature sensor output, which is indicative of a quantity of frequency error over time in the uncompensated frequency signal. The frequency error determining circuitry generates the control signal as a function of the determined quantity of frequency error in the uncompensated frequency signal. A counter receives the compensated frequency signal from the frequency conversion circuitry and provides as an output a digital representation of a time period based upon the compensated frequency signal.

DETAILED DESCRIPTION OF THE PREFERRED EMBODIMENTS

The present invention includes a low power time source (LPTS) for use in GPS receivers, and more particularly includes a high accuracy LPTS (HAL) and a GPS receiver using the same. The HAL of the present invention improves the timekeeping accuracy of the LPTS function by compensating for temperature induced variations in the frequency of the LPTS crystal. This increased accuracy enables faster direct Y-code GPS signal acquisition. The present invention utilizes either of two approaches. The first approach corrects the LPTS clock substantially continuously, while the second approach uses a single correction just prior to attempting satellite code acquisition. In some exemplary embodiments, the HAL of the present invention reduces the long term average LPTS time drift rate to 1 part per million (ppm) or less. However, other accuracies are possible depending upon calibration methods. Reducing time uncertainty enables faster direct Y-code acquisition.

Figure 1:
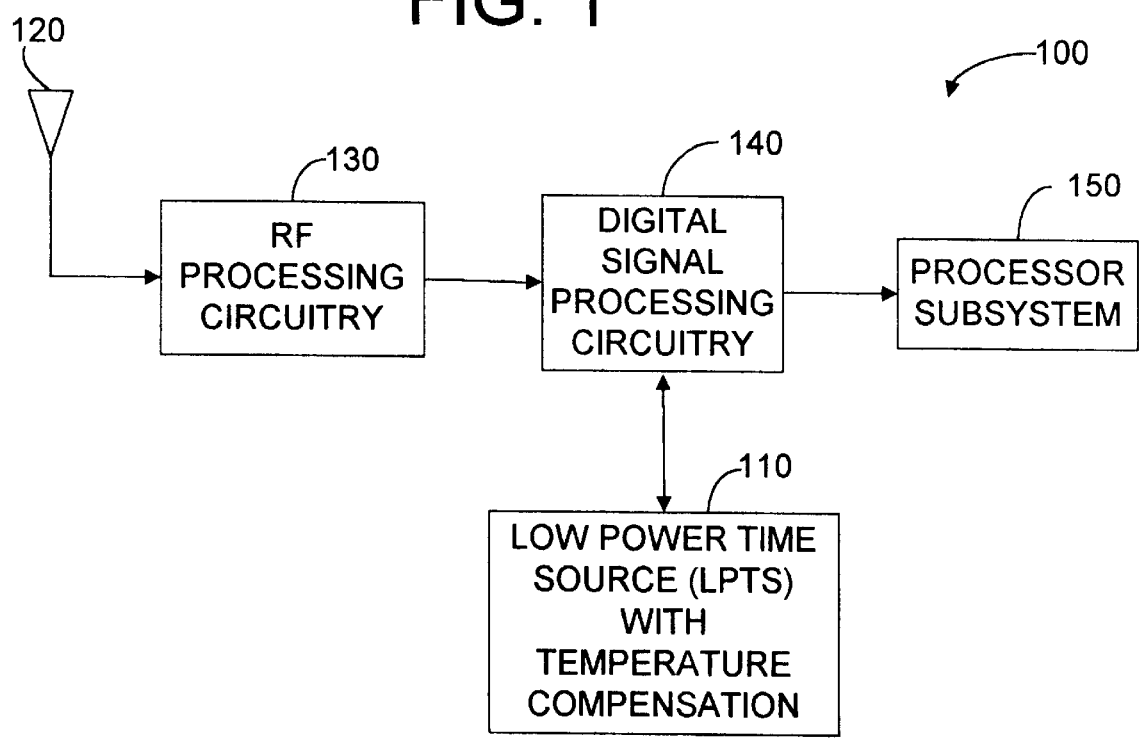
FIG. 1 is a block diagram illustrating a GPS receiver utilizing the HAL of the present invention.

FIG. 1 is a block diagram illustrating GPS receiver 100, in accordance with the present invention, utilizing a LPTS 110 having temperature compensation in order to provide a HAL. In addition to compensated LPTS or HAL 110, GPS receiver 100 includes radio frequency (RF) antenna 120, RF processing circuitry 130, digital signal processing (DSP) circuitry 140 and processor subsystem 150. RF antenna 120 can be an antenna array which receives GPS ranging signals from GPS satellites and provides the GPS ranging signals to DSP circuitry 140 for processing. DSP circuitry 140 can be adapted to perform a variety of well known GPS receiver functions relating to the received GPS ranging signals, including C/A-code and/or Y-code acquisition. Compensated LPTS 110 provides a highly accurate time reference for use by DSP circuitry 140 in Y-code acquisition from the received GPS ranging signals. Processor subsystem 150 can perform a wide variety of GPS receiver functions, including generation of a navigation solution for the receiver (i.e., determination of the receiver's position using the satellite ranging signals).

Figure 2:
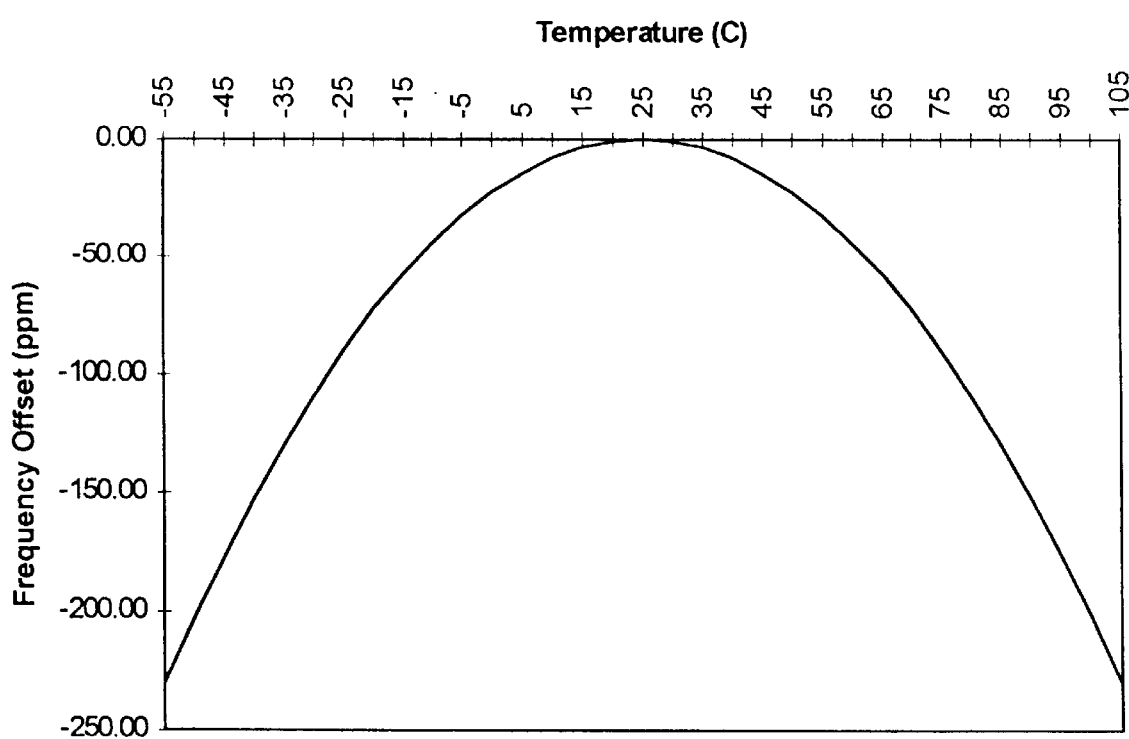
FIG. 2 is a plot illustrating the temperature response of a 32.768 KHz tuning fork crystal of the type used in GPS receiver LPTS such as the HAL of the present invention.

The LPTS in at least some GPS receivers typically includes a counter driven by a crystal oscillator. Crystal oscillators in the range of 10 KHz to 200 KHz typically use a crystal that resembles a small tuning fork. The frequency of such crystals changes with temperature as illustrated in the plot of FIG. 2. The frequency is maximum near room temperature but decreases in a near parabolic manner as the temperature is increased or decreased. The temperature at which the frequency is maximum is called the turning point temperature. This characteristic temperature response is commonly modeled with the following Equation:

Equation 1

$$\frac{\Delta F}{F_0} = -K(T - T_0)^2 \text{ [ppm]}$$

where $\Delta F$=change in frequency [Hz]

$F_0$=actual frequency at turning point [Hz]

K=parabolic constant [ppm/°C.$^{+2}$]

T=temperature [°C.]

$T_0$=temperature at turning point [°C.]

The parabolic coefficient K is typically in the range of 0.035 to 0.04 ppm/(°C.)$^2$ and the turning point is typically between 20° C. to 30° C. These values are relatively stable for any individual crystal. At operational temperature extremes (−55° C. and +105° C.), the slope of the parabola may reach 6.4 ppm/°C. Actual test data suggests that the temperature response is a not an exact parabola because the coefficient K varies with temperature.

Table 1 represents the typical characteristics of the parameters used in the parabolic model of crystal performance illustrated in FIG. 2.

TABLE 1

| | | Model Parameters | | |
|---|---|---|---|---|
| Parameter | Symbol | Nominal Value | Manufacturing Tolerance | Effect of Aging |
| Turning Point | $T_0$ | 25° C. | ±5 ° C. | unknown/negligible |
| Freq at Turning Point | $F_0$ | 32.768 KHz | ±30 ppm | <5 ppm/yr |
| Parabolic Constant | K | 0.035 × 10$^{-6}$ ppm/° C.$^2$ | not specified | unknown/negligible |

As will be discussed below with reference to FIGS. 3–7, to accommodate deviations from the simple parabolic model, LPTS 110 uses a look-up table built from calibration data in order to compensate the counter. This look-up table approach eliminates the need for an exact analytic description of the frequency versus temperature curve.

Figure 3:
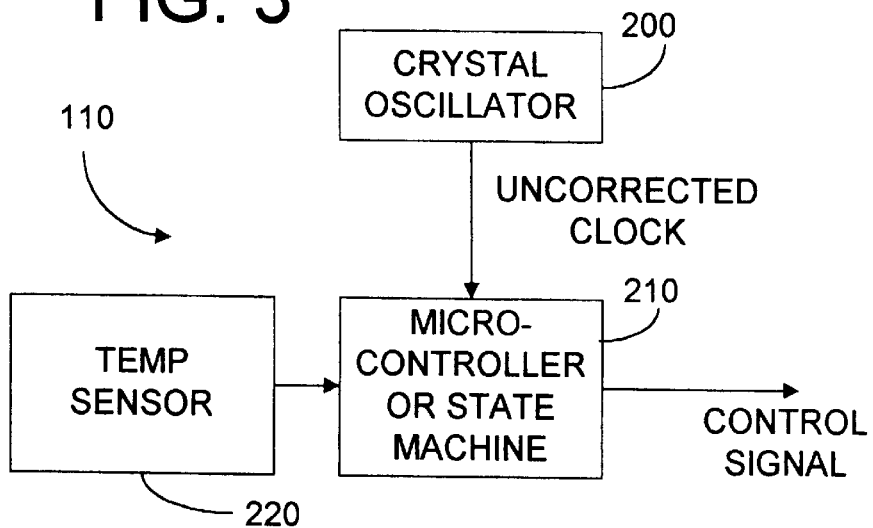
FIG. 3 is a block diagram illustrating embodiments of the HAL of the present invention.
Figure 4:
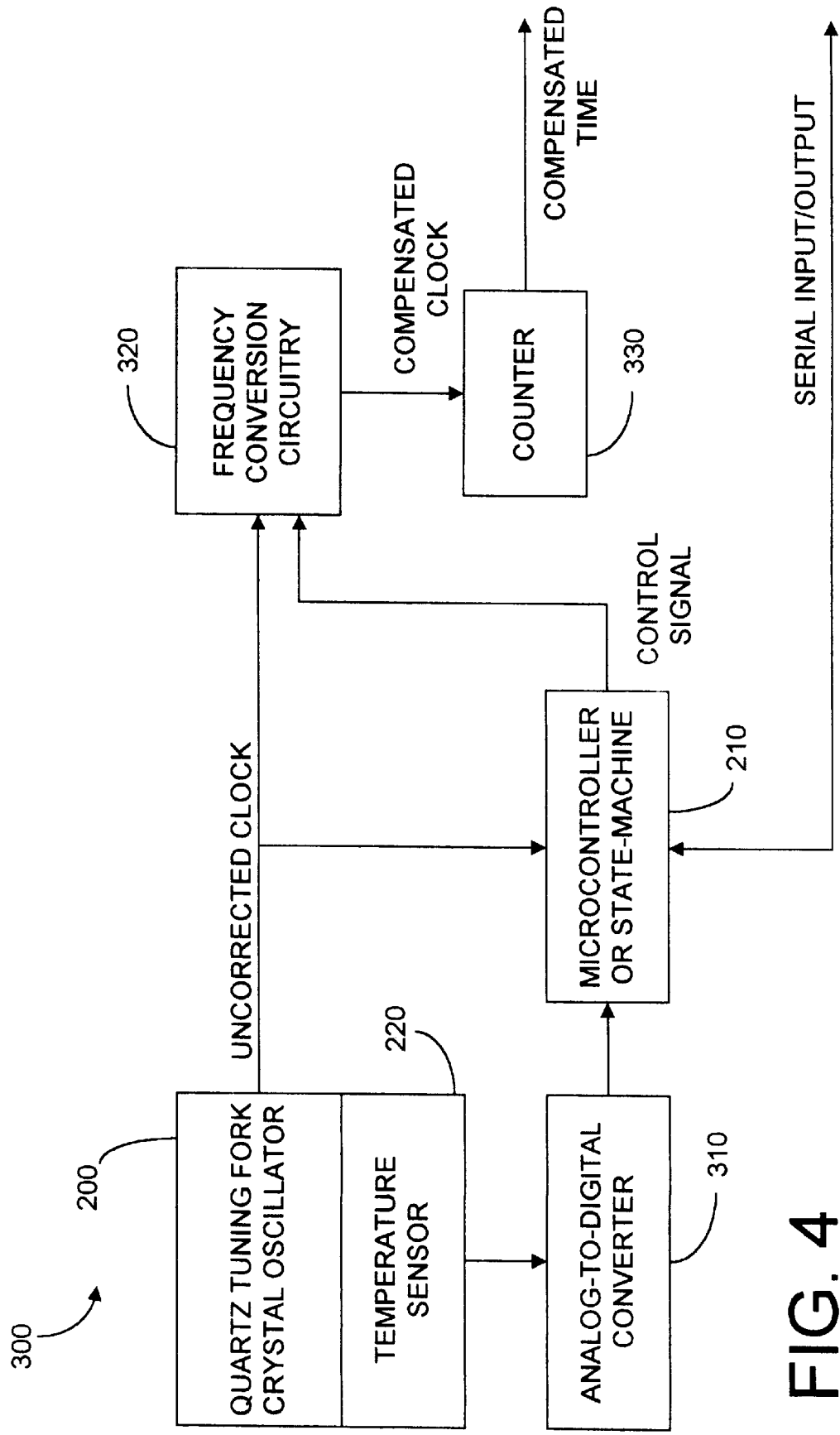
FIG. 4 is a block diagram illustrating first embodiments of the HAL illustrated in FIGS. 1 and 2 in greater detail, in which time correction to the LPTS time is applied substantially continuously.
Figure 5:
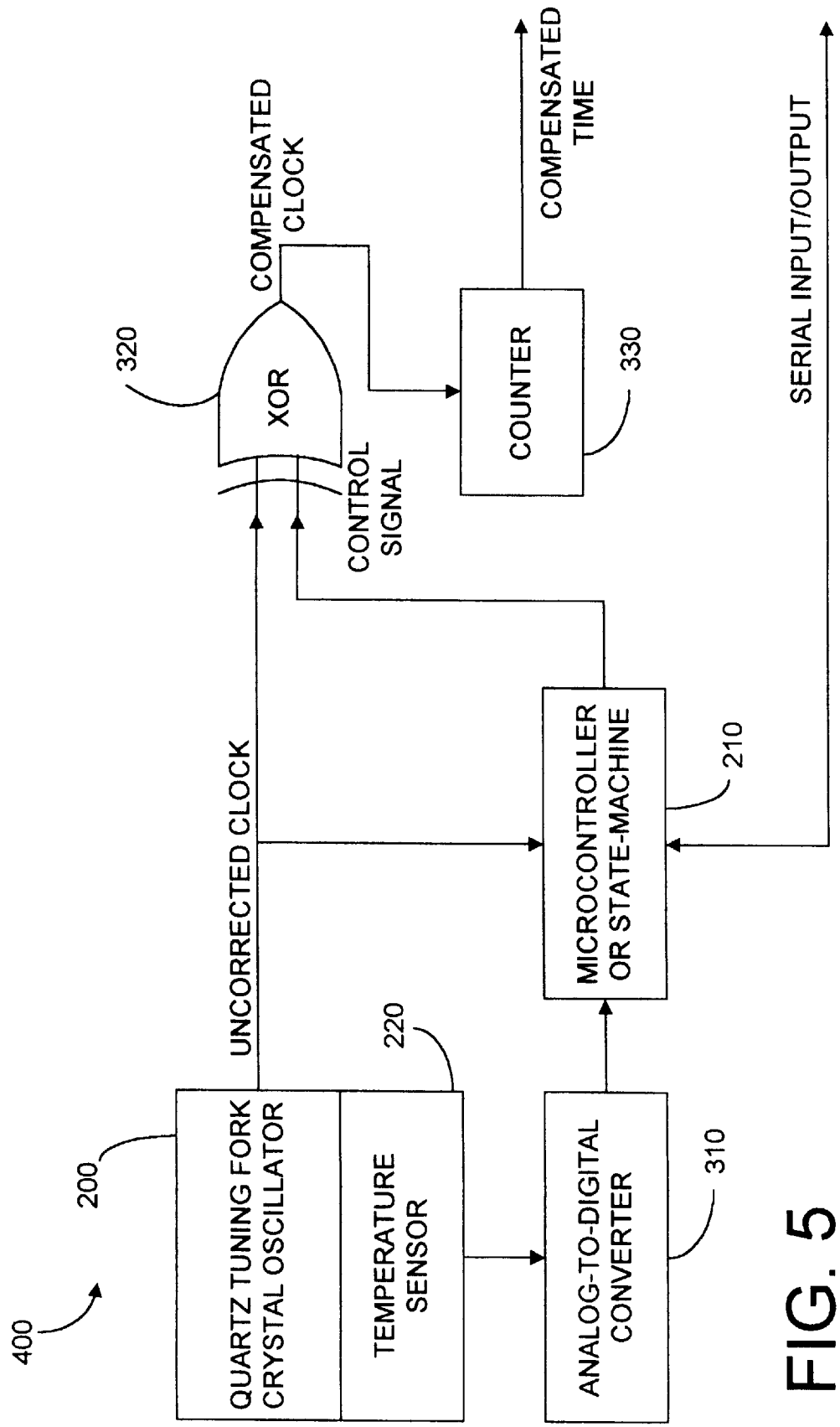
FIG. 5 is a block diagram illustrating one particular implementation of the frequency conversion circuitry of the HAL embodiment illustrated in FIG. 4.
Figure 7:
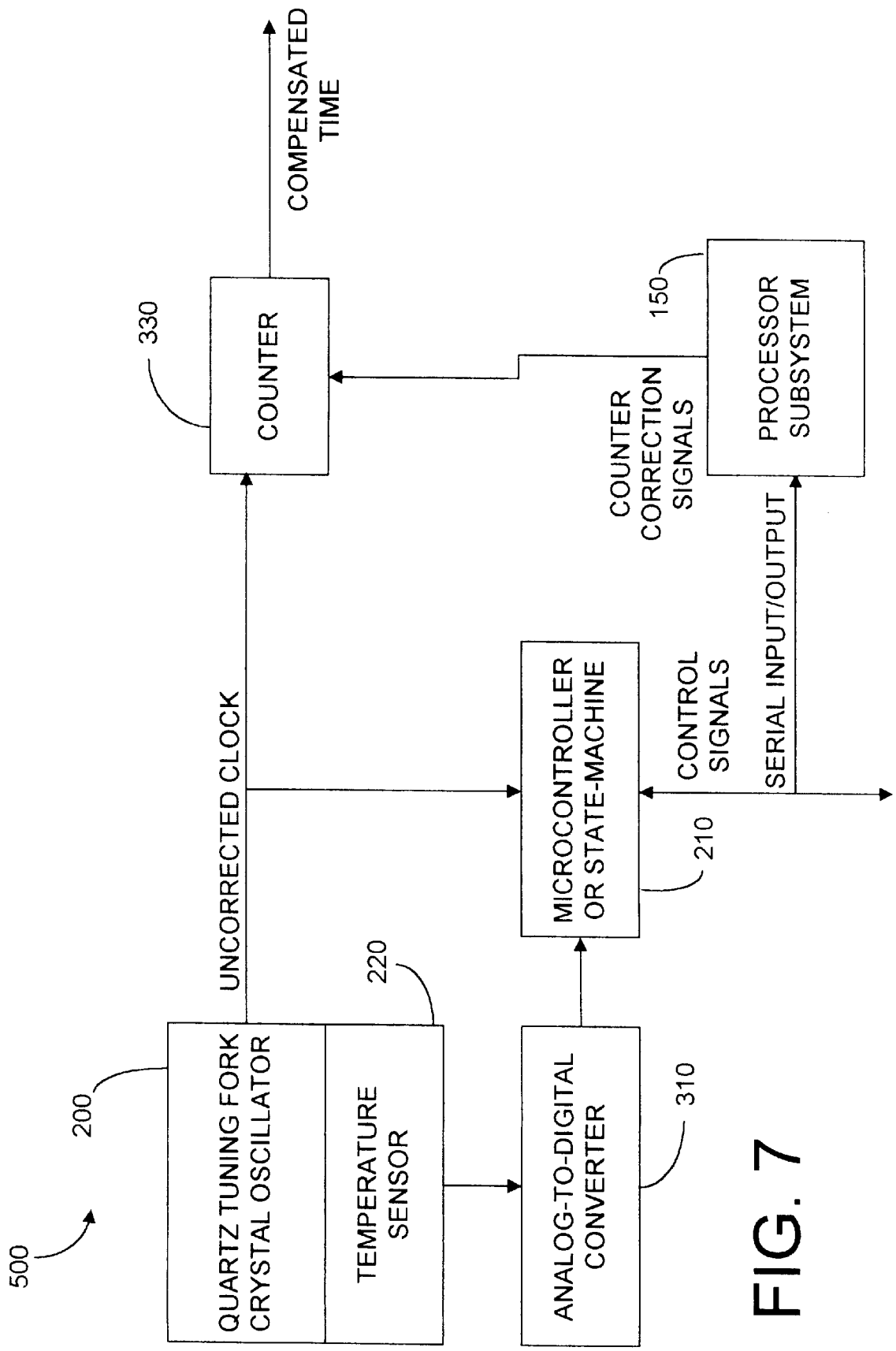
FIG. 7 is a block diagram illustrating second embodiments of the HAL illustrated in FIGS. 1 and 2 in greater detail, in which a one time correction to the LPTS time is applied immediately prior to satellite acquisition.

FIG. 3 is a block diagram illustrating portions of LPTS 110 in accordance with preferred embodiments of the present invention. More particular embodiments of the LPTS of the present invention are illustrated in FIGS. 4, 5 and 7. As illustrated in FIG. 3, LPTS 110 includes crystal oscillator 200, microcontroller or state machine 210, and temperature sensor 220. Crystal oscillator 200 provides an uncorrected clock signal to microcontroller 210. In preferred embodiments, the uncorrected clock signal is also provided to drive a counter (not shown in FIG. 3), with the counter output acting as a clock time reference.

When GPS receiver 100 is navigating, it can determine the current time with less than a 100 ns error using the GPS satellite signals. When receiver 100 is off, it relies on the battery powered LPTS to maintain an estimate of current time. Without compensation, the time maintained by LPTS 110 accumulates error due to temperature variations and other less significant factors.

In accordance with the present invention, in order to bound the LPTS time error to 1 ppm (2.6 sec/30 days), temperature compensation is provided. To provide this compensation, temperature sensor 220 is attached to the crystal of crystal oscillator 200. Temperature sensor 220 provides an output indicative of the temperature of the crystal. Using the temperature sensor output and the uncorrected clock signal as inputs, microcontroller 210 generates a control signal which is used to compensate the time reference provided by the counter to achieve the desired ppm time accuracy. The control signal generated by microcontroller 210 can be used to compensate the time reference in a variety of different ways, some of which are illustrated in FIGS. 4, 5 and 7. However, the microcontroller could alternatively include internal counter circuitry and simply itself provide the corrected or compensated clock reference as an output.

Manufacturing variations in K and $T_0$ referenced above in Equation 1 and in Table 1 can translate into 50 ppm variation among crystals at 80° C. from the turning point. Therefore, each compensated LPTS or HAL 110 is ideally individually calibrated in order to provide 1 ppm stability despite variations between crystals and other components. To calibrate each LPTS, a look-up table of frequency error versus temperature is created during a factory calibration process and stored in memory of microcontroller 210. Use of an individually calibrated look-up table instead of an analytic model also compensates for other component variations such as temperature sensor bias and non-linearity. During operation, microcontroller 210 uses temperature sensor information to determine the correct frequency error from the look-up table, and generates control or clock correction signals adapted to stabilize the average frequency. By achieving a stable average frequency, as opposed to providing a continuously stable oscillator signal frequency, the clock error over long periods of time cancels and 1 ppm accuracy is achieved.

The crystal oscillator's nominal frequency $F_0$ is known to slowly change with time. This aging effect decreases with time and is typically specified to be less than 5 ppm during the first year of use, decreasing thereafter. This slowly varying frequency bias error may be estimated by the receiver when it is tracking satellites.

FIG. 4 is a block diagram illustrating compensated LPTS or HAL 300 in accordance with preferred embodiments of the present invention. LPTS 300 is one of many possible implementations of LPTS 110 illustrated in FIGS. 1 and 2. LPTS 300 includes crystal oscillator 200, microcontroller or state machine 210, temperature sensor 220, analog-to-digital (A/D) converter 310, frequency conversion circuitry 320, and counter 330. As described above, crystal oscillator 200 provides a frequency signal which can be considered an uncorrected clock signal for the LPTS of the GPS receiver. In the alternative, it can be stated that, without compensation, the output of counter 330 driven by the oscillator frequency signal would be the uncorrected clock. As shown, the frequency signal from crystal oscillator 200 is provided to microcontroller 210 and to frequency conversion circuitry 320.

The analog output of temperature sensor 220 is provided to A/D converter 310 where it is digitized and provided to microcontroller 210. During calibration, the correction function of LPTS 300 is turned off such that the frequency conversion circuit passes the uncorrected oscillator signal to counter 330. In other words, either microcontroller 210 does not generate a control signal, or it generates a control signal which allows the oscillator signal to pass through circuitry 320 without correction of the average frequency. In this calibration mode, the serial output of microcontroller 210 is a digital representation of the temperature as sensed by the temperature sensor 220. The output of the counter 330 is the uncorrected clock. The uncorrected clock and the temperature data are correlated and recorded in order to build a look-up table. The look-up table correlates the frequency error in the oscillator signal with the particular temperature experienced by oscillator 200. Next, microcontroller 210 is placed in the serial input mode and the determined look-up table is stored into the microcontroller memory.

After calibration of LPTS 300, the digitized output of temperature sensor 220 is provided to microcontroller 210. Using the look-up table which is indicative of the crystal temperature response model, the microcontroller calculates when and what type of control or frequency correction signals to generate in order to achieve a stable average frequency. Typically the control signals are used to insert additional half-cycles into the oscillator output.

FIG. 5 illustrates LPTS 400, which is an embodiment of LPTS 300 in which frequency conversion circuitry 320 includes an XOR device having the uncorrected oscillator signal and the microcontroller control signal as inputs. In this embodiment, the half-cycles are inserted into the oscillator output, with the corrected oscillator output provided at the output of XOR device 320, by toggling the microcontroller input of the XOR device while the other input is driven directly by oscillator 200. While frequency conversion circuitry 320 can be an XOR device, in other embodiments circuitry 320 is any circuitry adapted to controllably alter the clock signal frequency to thereby produce a stable average frequency.

Figure 6:
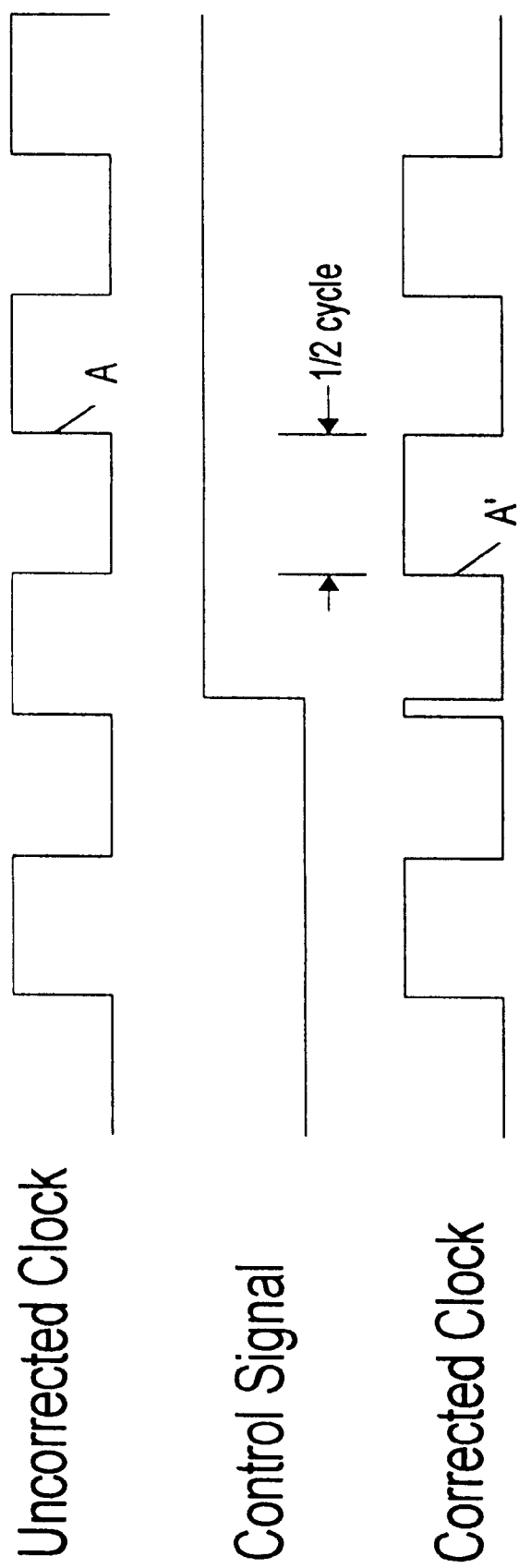
FIG. 6 is timing diagram illustrating a half-cycle clock adjustment in accordance with some preferred embodiments of the present invention.

The clock correction mechanism is illustrated by the timing diagram in FIG. 6. Using the XOR device frequency conversion circuit of FIG. 5 as an example, each time the control signal is toggled, it effectively advances the corrected clock signal by one-half cycle. The effect of the half-cycle corrections is to raise the average clock frequency at any temperature up to the peak frequency at the turning point (or even higher). This method depends on the inverted parabolic temperature response of tuning-fork crystals. Temperature compensation is typically achieved by adding clock cycles. However, in other embodiments, the frequency conversion circuitry can also be adapted to hold off or delete clock cycles if necessary.

At 32.768 KHz, each half-cycle inserted represents a 15.26 ppm correction when averaged over one second. Corrections to the clock signal frequency should be applied as evenly as possible so as to maximize the frequency stability of the output. As an example, correcting a 152.6 ppm error would require the insertion of 10 half-cycles per second. However, if the temperature is near the turning point so that only a 1.526 ppm correction is required, the effect of inserting a single half cycle would need to be averaged over 10 seconds. In general, due to the coarse size of the minimum correction in this particular example, correcting the LPTS interrupt frequency to 1 ppm will require 16 seconds and correcting it to 0.1 ppm will require 160 seconds (at a constant temperature).

If at most one correction is inserted during each cycle of a 32 Hz task, the maximum possible correction is 32×15.26 ppm=488.3 ppm=16 Hz. The following example illustrates how coarse corrections may be distributed over time. The 32 Hz task can implement any combination of the following subrates during a 16 second period: 32, 16, 8, 4, 2, 1, ½, ¼, ⅛, and 1/16 Hz. Using these rates, correction of a 200 ppm error may be accomplished as illustrated in the example of Table 2.

TABLE 2

| SUBRATE | APPLIED CORRECTION | REMAINING ERROR |
|---|---|---|
| 32 Hz | None because 200 ppm < 32 × 15.26 ppm | 200 ppm |
| 16 Hz | None because 200 ppm < 16 × 15.26 ppm | 200 ppm |
| 8 Hz | 8 × 15.26 ppm = 122.07 ppm | 77.93 ppm |
| 4 Hz | 4 × 15.26 ppm = 61.04 ppm | 16.89 ppm |
| 2 Hz | None because 16.89 ppm < 2 × 15.26 ppm | 16.89 ppm |
| 1 Hz | 1 × 15.26 ppm = 15.26 ppm | 1.64 ppm |
| 1/2 Hz | None because 1.64 ppm < 0.5 × 15.26 ppm | 1.64 ppm |
| 1/4 Hz | None because 1.64 ppm < 0.25 × 15.26 ppm | 1.64 ppm |
| 1/8 Hz | None because 1.64 ppm < 0.125 × 15.26 ppm | 1.64 ppm |
| 1/16 Hz | 0.0625 × 15.26 ppm = 0.95 ppm | 0.68 ppm |

The sum of the corrections illustrated in Table 2 is 199.32 ppm. Compensation is accomplished by inserting the half-cycle corrections in 209 of the 512 cycles corresponding to the 16 second period. The total correction will stabilize the average frequency to a point where the counter achieves a time accuracy of within 1 ppm after 16 seconds if the temperature remains constant. It is desirable to make use of full rate (32 Hz) temperature measurements in order to provide better compensation during periods of rapidly changing temperature. This approach is described in following paragraphs.

By way of example, the average frequency correction methods of the present invention can be implemented with a compensation algorithm as described below. The below described frequency compensation algorithm can be implemented on a simple 8-bit microcontroller. The algorithm is preferably executed continuously in a 32 Hz loop. All iterations of the loop should take the same time for the conversion to work optimally.

The basic mechanism of the algorithm is to look-up the frequency error (Look_Up(Temperature)) associated with the current temperature and to add this error to an error sum (Error_Sum). The half-cycle frequency correction is applied whenever the error sum exceeds the correction value (Correction_Value). Whenever a correction is applied, the error sum is reduced by the correction value. The accuracy of the correction is dependent on both the accuracy of the values in the look-up table (quality of temperature calibration) and the precision (number of bits) used to specify both the error values and the correction value. In one exemplary embodiment, the look-up table consists of 518 8-bit words organized as 256 by 16 (one value for each possible A/D reading). The look-up table values represent the number of $1/65536$ half-cycles that the uncorrected clock falls behind during the $1/32$ second loop period. The error values must also be adjusted to account for the increase in the loop period as the microcontroller clock slows down at hot and cold temperatures. In terms of frequency error, the units of the integer table entries are:

$$(1/65536) \times (1/2 \text{ cycle}) \div (1/32 \text{ second}) = (1/4096 \text{ Hz})$$

An example of the top-level pseudocode for implementation of the algorithm is as follows:

```
Error_Sum := 0;
loop      -- infinite loop, 32 iterations per sec
    Temperature := Value_Of (A2D_Converter);
    Error := Look_Up (Temperature);
    Error_Sum := Error_Sum + Error;
    if Error_Sum >= Correction_Value then
        Apply_Correction;
        Error_Sum := Error_Sum - Correction_Value;
    else
        Delay_For_Equal_Time;
    end if;
    Delay_Until_Next_Cycle_Time;
end loop;
```

This algorithm may be implemented on any 8-bit microcontroller with sufficient memory, or using a state machine or an application specific integrated circuit.

FIG. 7 is a block diagram illustrating an alternate LPTS or HAL 500. LPTS 500 differs structurally and/or functionally from LPTS 300 and LPTS 400 in that it does not include frequency conversion circuitry 320. Instead, the control signals from microcontroller 210 are provided directly to processor subsystem 150 as necessary. Processor subsystem 150 uses the microprocessor control signals to generate a counter correction signal which is provided to counter 330. In the alternative, microcontroller 210 can itself generate the counter correction signal and provide it directly to counter 330.

The alternate HAL concept used in LPTS 500 is premised on the fact that a precise time determination is not required until just before attempting satellite code acquisition. Using this concept, microcontroller 210 of LPTS 500 records the temperature history information needed to support a one time correction to the LPTS time provided by counter 330 immediately prior to satellite acquisition. Prior to the acquisition attempt, the main processor reads three values from the microcontroller 210, calculates the average frequency error, and generates a control signal which adjusts the output of counter 330 in order to correct the LPTS time based on this average error. The average frequency error may be calculated as follows:

$$\left(\frac{\Delta F}{F}\right)_{average} = \frac{1}{n}\sum_{i=1}^{n}(K(T_i - T_0)^2)$$

$$= \frac{K}{n}\sum_{i=1}^{n}(T_i^2 - 2T_iT_0 + T_0^2)$$

-continued $$= \frac{K}{n}\left(\sum_{i=1}^{n}T_i^2 - 2T_0\sum_{i=1}^{n}T_i + \sum_{i=1}^{n}T_0^2\right)$$

$$= \frac{K}{n}\left(\sum_{i=1}^{n}T_i^2 - 2T_0\sum_{i=1}^{n}T_i + nT_0^2\right)$$

Since K and $T_0$ are constants for a particular crystal, this calculation requires keeping track of only three quantities: the number of evenly spaced samples, the sum of the temperature readings (in the form of A/D counts), and the sum of the squared temperature readings (in the form of squared A/D counts). Since the range of A/D counts is limited, the corresponding squared value may be obtained from a look-up table. Assuming a worst case A/D count of 255 and a temperature sampling rate of 0.1 Hz, a 40 bit register could accumulate the sum of squared counts for over 5 years before overflowing.

LPTS 500 provides a number of advantages over LPTS embodiments in which the frequency is compensated on a substantially continuous basis. First, the microcontroller software is conceptually less complex in this batch mode type compensation scheme. Second, burn-in calibration procedures may be simplified. Also, the lack of a need for frequency compensation circuitry, such as an XOR device, may allow for a size reduction. Finally, power consumption may be reduced by taking less frequent temperature measurements, allowing the microcontroller to enter a sleep mode between measurements. However, LPTS 500 also has a number of disadvantages as compared to LPTS 300 and LPTS 400. For example, accuracy is reduced because actual frequency error doesn't exactly match the assumed parabolic model (deviations may exceed 15 ppm at temperature extremes). This can be mitigated by using a higher order model, or by using a small look-up table to correct the second order model. Also, LPTS 500 is less of a standalone component (no corrected frequency output). Finally, software complexity is transferred from microcontroller to the main processor, which may effect the performance of the main processor in its other functions.

Although the present invention has been described with reference to preferred embodiments, workers skilled in the art will recognize that changes may be made in form and detail without departing from the spirit and scope of the invention. For example, the HAL of the present invention can be extended to other signaling schemes requiring precise time for acquisition, including signals from sources other than GPS satellites.

What is claimed is:

1. A global positioning system (GPS) time source comprising:

an oscillator adapted to provide an uncompensated frequency signal having a quantity of frequency error over a time period relative to a desired frequency such that the uncompensated frequency signal has an average uncompensated frequency which is different than the desired frequency;

frequency conversion circuitry receiving the uncompensated frequency signal and a control signal as inputs, wherein during operation as a time source the frequency conversion circuitry provides as an output a compensated frequency signal as a function of the uncompensated frequency signal and the control signal, the compensated frequency signal having an average compensated frequency which is closer to the desired frequency than is the average uncompensated frequency;

a temperature sensor sensing a temperature of the oscillator and providing an output indicative of the sensed temperature;

frequency error determining circuitry coupled to the temperature sensor and generating the control signal as a function of the sensed temperature, and thereby as a function of a quantity of frequency error in the uncompensated frequency signal; and a counter receiving the compensated frequency signal from the frequency conversion circuitry as an input, the counter providing as an output a digital representation of a time period based upon the compensated frequency signal.

2. The GPS time source of claim 1, wherein the frequency error determining circuitry includes a microcontroller programmed with a look-up table correlating the temperature sensor output to quantities of frequency error, the microcontroller providing the control signal as a function of the quantity of frequency error associated with the temperature represented by the temperature sensor output.

3. The GPS time source of claim 2, wherein the microcontroller includes a serial input/output (I/O), and wherein in a calibration mode in which the look-up table is created the microcontroller generates the control signal such that the output of the frequency conversion circuitry is the uncompensated frequency signal, and wherein in the calibration mode the microcontroller is adapted to provide as an output on the serial I/O a digital signal indicative of temperatures sensed by the temperature sensor, wherein the look-up table is created by correlating the sensed temperatures to errors in the digital representation of time provided by the counter when driven with the uncompensated frequency conversion circuitry, and wherein in a programming mode the microcontroller receives the look-up table on the serial I/O and stores the look-up table in microcontroller memory.

4. The GPS time source of claim 1, wherein the frequency error determining circuitry includes a state machine device.

5. The GPS time source of claim 1, wherein the frequency error determining circuitry includes an application specific integrated circuit (ASIC).

6. The GPS time source of claim 1, wherein the frequency conversion circuitry includes an XOR device.

7. The GPS time source of claim 1, wherein the frequency conversion circuitry is adapted to provide the compensated frequency signal by controllably adding cycles to the uncompensated frequency signal in order to increase the average compensated frequency relative to the average uncompensated frequency.

8. The GPS time source of claim 1, wherein the frequency conversion circuitry is adapted to provide the compensated frequency signal by controllably removing cycles from the uncompensated frequency signal in order to decrease the average compensated frequency relative to the average uncompensated frequency.

9. The GPS time source of claim 1, and further comprising an analog-to-digital (A/D) converter coupled between the temperature sensor and the frequency error determining circuitry, the A/D converter digitizing the temperature sensor output and providing the digitized temperature sensor output to the frequency error determining circuitry for use in generating the control signal.

10. A global positioning system (GPS) receiver comprising:

GPS signal receiving means for receiving Y-code modulated GPS signals from a plurality of GPS satellites;

signal processing means for directly acquiring from the modulated GPS signals the Y-code used to modulate the GPS signals;

low power time source means for providing to the signal processing means a digital representation of a time period for use in direct Y-code acquisition, the low power time source means comprising:

an oscillator adapted to provide an uncompensated frequency signal having a quantity of frequency error over a time period relative to a desired frequency such that the uncompensated frequency signal has an average uncompensated frequency which is different than the desired frequency; and a counter operably coupled to the oscillator and generating as a function of the uncompensated frequency signal a digital representation of a time period; and compensation means for compensating the digital representation of the time period in order to minimize temperature dependent errors in the digital representation of the time period.

11. The GPS receiver of claim 10, wherein the compensation means includes:

a temperature sensor sensing a temperature of the oscillator and providing an output indicative of the sensed temperature;

frequency error determining circuitry coupled to the temperature sensor and generating a control signal as a function of the sensed temperature, and thereby as a function of a quantity of frequency error in the uncompensated frequency signal, wherein the counter also provides the digital representation of the time period as a function of the control signal.

12. The GPS receiver of claim 11, wherein the frequency error determining circuitry provides the control signal to the counter, wherein the counter adjusts the digital representation of the time period as a function of the control signal.

13. The GPS receiver of claim 11, and further comprising frequency conversion circuitry operably coupled between the oscillator and the counter, the frequency conversion circuitry receiving the uncompensated frequency signal and the control signal as inputs and providing to the counter a compensated frequency signal as a function of the uncompensated frequency signal and the control signal, the compensated frequency signal having an average compensated frequency which is closer to the desired frequency than is the average uncompensated frequency, the counter generating the digital representation of the time period as a function of the compensated frequency signal.

14. The GPS receiver of claim 13, wherein the frequency conversion circuitry is adapted to provide the compensated frequency signal by controllably adding cycles to the uncompensated frequency signal in order to increase the average compensated frequency relative to the average uncompensated frequency.

15. The GPS receiver of claim 13, wherein the frequency conversion circuitry is adapted to provide the compensated frequency signal by controllably removing cycles from the uncompensated frequency signal in order to decrease the average compensated frequency relative to the average uncompensated frequency.

16. The GPS receiver of claim 11, wherein the frequency error determining circuitry includes a microcontroller programmed with a look-up table correlating the temperature sensor output to quantities of frequency error, the microcontroller providing the control signal as a function of the quantity of frequency error associated with the temperature represented by the temperature sensor output.

17. A method of providing a high accuracy time source for use in a global positioning system receiver for direct Y-code acquisition of GPS satellite signals, the method comprising:

provided an uncompensated clock signal having a quantity of frequency error over a time period relative to a desired frequency such that the uncompensated clock signal has an average uncompensated frequency which is different than the desired frequency;

sensing a temperature affecting the frequency error in the uncompensated clock signal;

generating a control signal as a function of the sensed temperature, and thereby as a function of the quantity of frequency error over the time period;

XORing the uncompensated clock signal and the control signal to provide a compensated clock signal; and counting cycles of the compensated clock signal to provide a digital representation of the time period.

* * * * *